US012622189B2

(12) United States Patent
Biard et al.

(10) Patent No.: US 12,622,189 B2
(45) Date of Patent: May 5, 2026

(54) METHOD FOR MANUFACTURING A COMPOSITE STRUCTURE COMPRISING A THIN SINGLE-CRYSTAL SEMICONDUCTOR LAYER ON A CARRIER SUBSTRATE

(71) Applicant: Soitec, Bernin (FR)

(72) Inventors: Hugo Biard, Bernin (FR); Didier Landru, Bernin (FR)

(73) Assignee: Soitec, Bernin (FR)

( * ) Notice: Subject to any disclaimer, the term of this patent is extended or adjusted under 35 U.S.C. 154(b) by 364 days.

(21) Appl. No.: 18/546,057

(22) PCT Filed: Mar. 14, 2022

(86) PCT No.: PCT/FR2022/050454
§ 371 (c)(1),
(2) Date: Aug. 10, 2023

(87) PCT Pub. No.: WO2022/200712
PCT Pub. Date: Sep. 29, 2022

(65) Prior Publication Data
US 2024/0112908 A1 Apr. 4, 2024

(30) Foreign Application Priority Data

Mar. 23, 2021 (FR) ...................................... 2102921

(51) Int. Cl.
*H10P 14/60* (2026.01)
*H10P 30/20* (2026.01)
*H10P 90/00* (2026.01)

(52) U.S. Cl.
CPC .......... *H10P 14/6548* (2026.01); *H10P 30/20* (2026.01); *H10P 90/1914* (2026.01)

(58) Field of Classification Search
None
See application file for complete search history.

(56) References Cited

U.S. PATENT DOCUMENTS 6,191,007 B1 2/2001 Matsui et al.
8,436,363 B2 5/2013 Werkhoven et al.
(Continued)

FOREIGN PATENT DOCUMENTS

JP H09-181011 A 7/1997
JP 2005-079393 A 3/2005
(Continued)

OTHER PUBLICATIONS

Taiwanese Office Action and Search Report for Application No. 111109268 dated July 2, 0215, 7 pages with machine translation.
(Continued)

*Primary Examiner* — Bradley Smith
(74) *Attorney, Agent, or Firm* — TraskBritt

(57) ABSTRACT

A method of manufacturing a composite structure comprises: a) providing a donor substrate of a single-crystal semiconductor material, b) implanting ions into the donor substrate, excluding an annular peripheral region, to form a buried brittle plane, the implantation conditions defining a first thermal budget for obtaining bubbling on a face of the donor substrate and a second thermal budget for obtaining a fracture in the brittle plane, c) forming a stiffening film on the donor substrate, carried out by applying a thermal budget lower than the first thermal budget, the stiffening film being perforated in the form of a mesh, the perforated stiffening film leaving a plurality of zones of the front face bare, d) depositing a carrier substrate on the donor substrate carried out by applying a thermal budget greater than the first thermal budget, and e) separating the donor substrate along the brittle plane.

19 Claims, 4 Drawing Sheets

(56) References Cited

U.S. PATENT DOCUMENTS

| 2004/0092087 | A1 | 5/2004 | Aspar et al. |
| 2012/0199845 | A1* | 8/2012 | Werkhoven ............. H10D 62/00 |
| | | | 257/77 |
| 2016/0233125 | A1 | 8/2016 | Landru et al. |
| 2017/0243781 | A1 | 8/2017 | Peidous et al. |
| 2023/0406696 | A1* | 12/2023 | Darras ................ B81C 1/00158 |

FOREIGN PATENT DOCUMENTS

| TW | 201841302 A | 11/2018 |
| WO | 2018/149906 A1 | 8/2018 |

OTHER PUBLICATIONS

Aspar et al., The Generic Nature of the Smart Cut Process for Thin Film Transfer, Journal of Electronic Materials, vol. 30, No. (2001), pp. 834-840.

Bedell et al., Investigation of Surface Blistering of Hydrogen Implanted Crystals, Journal of Applied Physics, vol. 90, (2001), pp. 1138-1146.

International Search Report for Application No. PCT/FR2022/050454 dated Jun. 2, 2022, 2 pages.

International Written Opinion for Application No. PCT/FR2022/050454 dated Jun. 2, 2022, 8 pages.

* cited by examiner

METHOD FOR MANUFACTURING A COMPOSITE STRUCTURE COMPRISING A THIN SINGLE-CRYSTAL SEMICONDUCTOR LAYER ON A CARRIER SUBSTRATE

CROSS-REFERENCE TO RELATED APPLICATIONS

This application is a national phase entry under 35 U.S.C. § 371 of International Patent Application PCT/FR2022/050454, filed Mar. 14, 2022, designating the United States of America and published as International Patent Publication WO 2022/200712 A1 on Sep. 29, 2022, which claims the benefit under Article 8 of the Patent Cooperation Treaty of French Patent Application Serial No. FR2102921, filed Mar. 23, 2021.

TECHNICAL FIELD

The present disclosure relates to the field of semiconductors for microelectronic components. It, in particular, relates to a method for fabricating a composite structure comprising a thin layer made of single-crystal semiconductor placed on a carrier substrate: the thin layer may, for example, be made of single-crystal silicon carbide and the carrier substrate made of polycrystalline silicon carbide.

BACKGROUND

Silicon carbide (SiC) is increasingly widely used to fabricate innovative power devices meeting the needs of growing fields of application of electronics, such as electric vehicles, in particular.

Specifically, power devices and integrated power-supply systems based on single-crystal silicon carbide are able to handle a much higher power density than their conventional silicon equivalents, and to do so with active regions of smaller size. To further limit the dimensions of power devices on SiC, it is advantageous to produce vertical rather than lateral components. For this, vertical electrical conduction, between an electrode positioned on the front side of the SiC structure and an electrode positioned on the back side, must be permitted by the structure.

Nevertheless, single-crystal SiC substrates intended for the microelectronics industry remain expensive and difficult to produce with large diameters. It is therefore advantageous to employ solutions for transferring thin layers to produce composite structures, which typically comprise a thin layer of single-crystal SiC on a less expensive carrier substrate. One well-known solution for transferring thin layers is the Smart Cut® process, which is based on implantation of light ions and bonding by direct bonding. Such a process, for example, makes it possible to fabricate a composite structure, which comprises, in direct contact, a thin layer of single-crystal SiC (c-SiC) detached from a donor substrate made of c-SiC, and a carrier substrate made of polycrystalline SiC (p-SiC), and which permits vertical electrical conduction. Nevertheless, it remains difficult to produce by molecular adhesion a good-quality direct bond between two c-SiC and p-SiC substrates, since dealing with the surface finish and roughness of the substrates is complex.

U.S. Pat. No. 8,436,363 avoids direct bonding by providing a method for fabricating a composite structure comprising a thin layer made of c-SiC placed on a metal carrier substrate the coefficient of thermal expansion of which matches that of the thin layer. This fabricating method comprises the following steps:

forming a buried weak plane in a c-SiC donor substrate, delimiting a thin layer between the buried weak plane and a front surface of the donor substrate, depositing a metal layer, for example, made of tungsten or molybdenum, on the front side of the donor substrate in order to form a carrier substrate of a sufficient thickness to play the role of stiffener, splitting along the buried weak plane, leading to cleaving between, on the one hand, the composite structure comprising the metal carrier substrate and the thin layer made of c-SiC and, on the other hand, the remainder of the donor substrate made of c-SiC.

Such a fabricating method is however incompatible when the material from which the carrier substrate is formed is p-SiC, which requires deposition at temperatures higher than 1000° C., or even higher than or equal to 1200° C. (usual temperatures for the fabrication of p-SiC). Specifically, at these high temperatures, the rate of growth of the cavities and microcracks present in the buried weak plane is higher than the rate of growth of the p-SiC layer, and the thickness required for a stiffening effect to be achieved is not reached before the onset of blistering, which is related to deformation of the thin layer plumb with the microcracks.

Although the underlying problem was described above with reference to a composite structure made of silicon carbide, it may arise with any type of semiconductor from which it is envisioned to detach a thin layer using a weakening technique based on implantation of a light species, and for which the thermal budget that results in blistering (blistering activation budget) is lower than the thermal budget required for the deposition of the carrier substrate.

The thermal budgets of blistering and splitting have been widely studied for many single-crystal semiconductors such as silicon, silicon carbide, germanium, III-V compounds, etc. (see, for example, Aspar et al., "The generic nature of the Smart Cut® process for thin film transfer," Journal of Electronic Materials, vol. 30, no. 7, July 2001, or Bedell et al., "Investigation of surface blistering of hydrogen implanted crystals," Journal of Applied Physics, volume 90, no. 3, August 2001). It is known that the kinetics of blistering and the kinetics of splitting depend on the properties of the buried weak plane, which are defined by the nature of the semiconductor and by the ion-implantation conditions applied to the donor substrate: in particular, the implantation energy of the light species defines the depth of the buried weak plane, and the implanted dose defines the amount of species able to form/develop into microcavities and to place them under pressure when thermally activated; other implantation parameters, including temperature, will also influence the properties of the buried weak plane and the associated kinetics of blistering and splitting.

Blistering occurs when there is an insufficient stiffening effect on the free side of the donor substrate, and splitting occurs when there is a sufficient stiffening effect on this free side to allow the microcracks to merge in the buried weak plane, without deforming the layer above, thus causing complete splitting along the buried weak plane.

On account of these physical effects, definition of a thin layer (typically of thickness smaller than 1.5 microns) in a donor substrate (via a weak buried plane resulting from implantation of ions of a light species) and formation of a carrier substrate by deposition, with application of a thermal budget higher than the thermal budget of blistering, would appear to be incompatible.

The present disclosure addresses the aforementioned problem. It relates to a method for fabricating a composite structure comprising a thin layer made of a single-crystal semiconductor placed on a carrier substrate of lower quality, the composite structure being capable, furthermore, of procuring a vertical electrical conduction between the thin layer and the carrier substrate.

The present disclosure relates to a method for fabricating a composite structure comprising a thin layer made of a single-crystal semiconductor, the thin layer being placed on a carrier substrate, the method comprising:

a) a step of providing a donor substrate composed of the single-crystal semiconductor, b) a step of implanting ions of a light species into the donor substrate, with the exception of an annular peripheral region of the substrate, under implantation conditions, to form a buried weak plane delimiting the thin layer between the buried weak plane and a front side of the donor substrate, the buried weak plane comprising lenticular microcavities apt to develop, when activated thermally, into microcracks, the implantation conditions defining a first thermal budget for obtaining blistering on the front side of the donor substrate, and a second thermal budget for obtaining splitting in the buried weak plane, the blistering corresponding to deformation of the thin layer plumb with the microcracks, and the splitting corresponding to complete splitting in the buried weak plane, c) a step of forming a stiffening film on the donor substrate, this step being carried out with application of a thermal budget lower than the first thermal budget, the stiffening film:

being apertured and taking, in the plane of the front side, the form of a grid with a degree of coverage of between 5% and 30%, and leaving a plurality of regions of the front side bare, these regions taking the form of features the lateral dimensions of which are smaller than or equal to 50 microns, and having a thickness larger than or equal to 0.5 microns, d) a step of depositing a carrier substrate on the front side of the donor substrate, which front side is equipped with the stiffening film, this step being carried out with application of a thermal budget higher than the first thermal budget, e) a step of cleaving, to form on the one hand the composite structure and on the other hand the remainder of the donor substrate.

According to other advantageous and non-limiting features of the present disclosure, which are applicable individually or in any technically feasible combination:

the annular peripheral region of the donor substrate, i.e., the region in which ions are not implanted in step b), has a width between 1 mm and 2 cm;

step d) is carried out with application of a thermal budget higher than or equal to the second thermal budget;

the single-crystal semiconductor of the donor substrate is chosen from silicon carbide, silicon, germanium, a III-V or III-N compound, diamond, and gallium oxide;

the stiffening film comprises a material chosen from tungsten, silicon carbide, silicon, silicon nitride, boron nitride, silicon oxide, aluminum oxide, and aluminum nitride;

step c) comprises one or more sequences of depositing, bonding, photolithography, nanoimprinting, etching and/or thinning;

the thickness of the apertured stiffening film is between 0.5 microns and 5 microns;

the carrier substrate has a single-crystal or polycrystalline structure and comprises at least one material chosen from silicon carbide, silicon, diamond, III-V or III-N compounds such as gallium nitride, and gallium oxide;

at the end of the deposition of step d), the carrier substrate has a thickness larger than or equal to 50 microns;

the fabricating method comprises a step f) of carrying out one or more mechanical and/or chemical and/or heat treatments on the composite structure, in order to smooth the free surface of the thin layer and/or to improve the quality of the edges of the composite structure and/or to correct the thickness uniformity of the composite structure;

one (or more than one) mechanical or chemical treatment(s) of step f) is (are) carried out before cleaving step e) to improve the quality of the edges of a stack resulting from step d) and/or to correct the thickness uniformity of the carrier substrate;

the fabricating method comprises a step of reconditioning the remainder of the donor substrate with a view to reusing it as donor substrate.

The present disclosure also relates to a composite structure resulting from the above fabricating method, comprising a power component all or some of which is formed on and/or in the thin layer, and comprising a metal electrode on a back side of the carrier substrate.

BRIEF DESCRIPTION OF THE DRAWINGS

Further features and advantages of the present disclosure will become apparent on reading the following detailed description of the present disclosure with reference to the accompanying figures, in which.

In the figures, elements of the same type will possibly have been designated by the same references. The figures are schematic representations, which, for the sake of readability, are not to scale. In particular, the thicknesses of the layers along the z-axis are not to scale with respect to the lateral dimensions along the x- and y-axes; and the relative thicknesses of the layers with respect to one another have not necessarily been respected in the figures.

DETAILED DESCRIPTION

Figure 1:
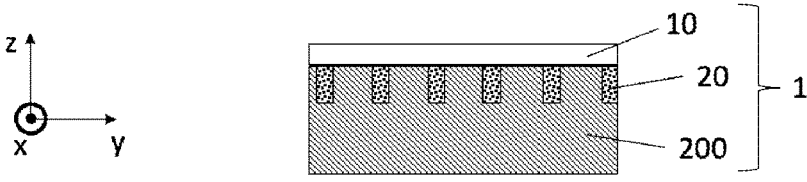
FIG. 1 shows a composite structure produced using a fabricating method according to the present disclosure.

The present disclosure relates to a method for fabricating a composite structure 1 comprising a thin layer 10 made of a single-crystal semiconductor placed on a carrier substrate 200, i.e., a structure such as shown in FIG. 1.

The method firstly comprises a step a) of providing a donor substrate 111 composed of the single-crystal semiconductor from which the thin layer 10 is intended to be composed. This single-crystal semiconductor will possibly be chosen from silicon carbide, silicon, germanium, a III-V or III-N compound, diamond, gallium oxide (Ga$_2$O$_3$) or other materials for which detachment of a thin layer would be advantageous.

Figure 2A:
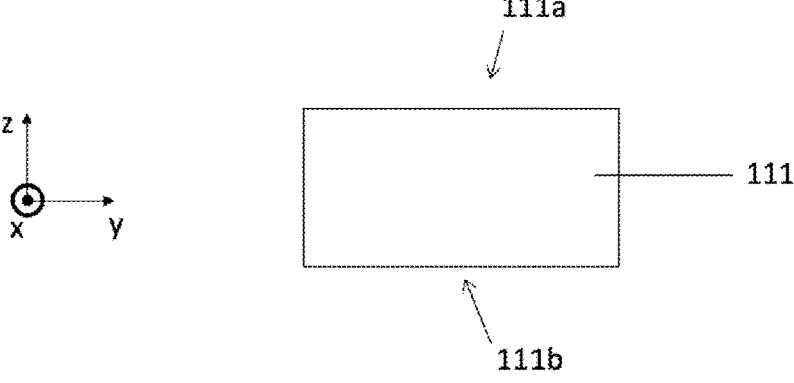
FIGS. 2A, 2A', 2B, 2C, 2D, 2E and 2F show steps of a fabricating method according to the present disclosure.
Figure 2A:
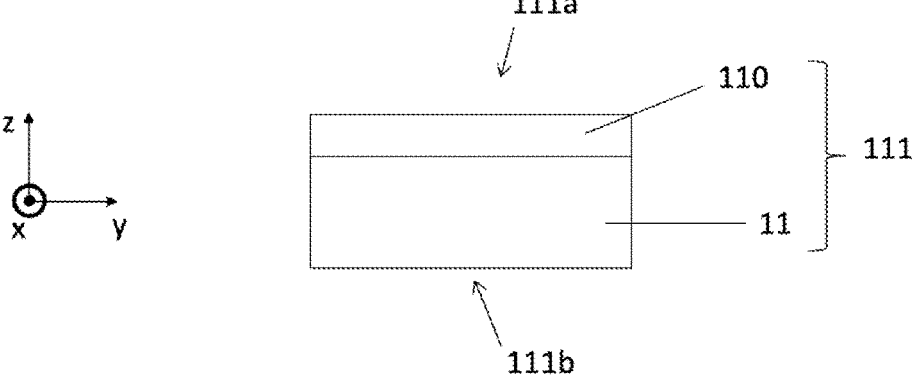

The donor substrate 111 preferably takes the form of a circular wafer with a diameter of 100 mm, 150 mm, 200 mm, or indeed 300 mm or even 450 mm, and with a thickness typically between 300 and 800 microns. It has a front side 111*a* and a back side 111*b* (FIG. 2A). The surface roughness of the front side 111*a* is advantageously chosen to be less than 1 nm Ra (average roughness) as measured by atomic force microscopy (AFM) with a scan of 20 microns×20 microns.

Subsequently in the method, the thin layer 10 of the composite structure will be detached from the donor substrate 111: the thin layer 10 must therefore have the mechanical, electrical and crystallographic properties required for the targeted application.

According to one particular embodiment, the donor substrate 111 comprises an initial substrate 11 made of the single-crystal semiconductor and a donor layer 110 that is also formed from this material, and which is produced by epitaxial growth on the initial substrate 11 (FIG. 2A'). The step of epitaxial growth is carried out such that the donor layer 110 has a density of crystal defects lower than that of the initial substrate 11. The thin layer 10 will, in this case, be detached from the donor layer 110: the quality of the initial substrate 11 does not therefore need to be as high as the quality of the donor layer 110.

By way of illustration of this particular embodiment, the initial substrate 11 is made of single-crystal SiC (c-SiC) of 4H or 6H polytype and has an offcut angle smaller than or equal to 4.0°±0.5° with respect to the <11-20> crystallographic axis, and a density of threading dislocations (micropipes) lower than or equal to 5/cm², or even lower than 1/cm². N-doped (nitrogen-doped), it preferably has a resistivity between 0.015 ohm·cm and 0.030 ohm·cm. An initial substrate 11 having a low density, typically lower than or equal to 3000/cm², of basal plane dislocation-type defects (BPDs) may be chosen. c-SiC substrates exhibiting densities of BPDs of the order of 1500/cm² are reasonably available, this facilitating provision thereof.

Extended defects in the thin layer 10 may affect component performance and reliability. The c-SiC donor layer 110 is thus produced so as to have a density of BPDs lower than or equal to 1/cm². To do this, the epitaxial growth of the donor layer 110 is carried out at a temperature higher than 1200° C., and preferentially between 1500° C. and 1900° C. The precursors used are silane ($SiH_4$), propane ($C_3H_8$) or ethylene ($C_2H_4$); and the carrier gas will possibly be hydrogen, optionally mixed with argon. The low density of BPDs in the donor layer 110 is obtained by favoring the conversion of the BPDs present in the initial substrate 11 into threading edge dislocations (TEDs).

Figure 2B:
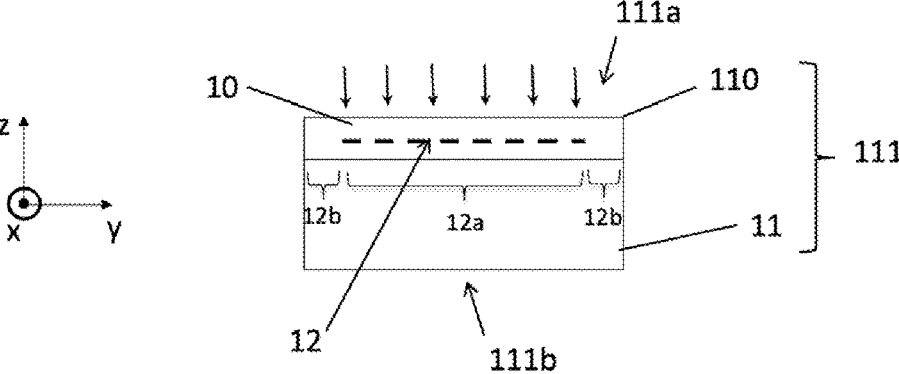

Returning to the general description of the fabricating method according to the present disclosure, the method comprises a step b) of implanting ions of a light species into the donor substrate 111, to a predetermined depth representative of the thickness desired for the thin layer 10. It will be noted that the depth will always be smaller than the thickness of the donor layer 110, when the donor layer 110 is present. This implantation generates a buried weak plane 12 that delimits the thin layer 10 between the buried weak plane 12 and a front side 111*a* of the donor substrate 111 (FIG. 2B).

The ion implantation is carried out so as to form a buried weak plane 12 in a central region 12*a* of the donor substrate 111, but not in an annular peripheral region 12*b*. To do this, a mask is, for example, applied, to the front side 111*a*, facing the annular peripheral region 12*b*, in the ion implantation step, so as to prevent ions from penetrating into this annular peripheral region 12*b* of the donor substrate 111.

Preferably, the annular peripheral region 12*b* has a width between 1 mm and 2 cm; in other words, the buried weak plane 12 is absent from an annular peripheral region 12*b* extending from the edge of the donor substrate 111 a distance between 1 mm and 2 cm toward the center of the donor substrate 111. The importance of this annular peripheral region 12*b* in which the initial substrate 11 comprises no buried weak plane 12 will be returned to later on.

The implanted light species are preferably hydrogen, helium or both these species co-implanted. With reference to the Smart Cut® process, as is well known the light species will form, around the determined depth, microcavities distributed in a thin layer parallel to the front side 111*a* of the donor substrate 111, i.e., parallel to the (x,y)-plane in the figures. This thin layer is called the buried weak plane 12, for the sake of simplicity.

The implantation energy of the light species is chosen so as to ensure they reach the determined depth in the donor substrate 111. Typically, hydrogen ions are implanted with an energy between 10 keV et 250 keV, and with a dose between $5^E16/cm^2$ and $1^E17/cm^2$, to delimit a thin layer 10 having a thickness between 100 and 1500 nm, this thickness of course depending on the nature of the semiconductor of the donor substrate 111.

It will be noted that a thin protective layer will possibly be deposited on the front side 111*a* of the donor substrate 111, prior to the ion implantation step. This protective layer may be made of a material such as silicon oxide or silicon nitride, for example, and will possibly be removed at the end of step b).

As mentioned above, the buried weak plane 12 comprises lenticular microcavities apt to develop, when activated thermally, into microcracks. In the chosen single-crystal semiconductor of the donor substrate 111, the implantation conditions define a first thermal budget for obtaining blistering on the front side 111*a* of the donor substrate 111: this first thermal budget may be reached by applying various temperatures for various annealing times such as to cause blistering to occur (blistering activation budget). The implantation conditions also define a second thermal budget for obtaining splitting in the buried weak plane 12: this second thermal budget may be reached by applying various temperatures for various annealing times such as to cause splitting to occur spontaneously (splitting activation budget). It will be recalled that blistering corresponds to deformation of the thin layer 10 plumb with the microcracks, when the front side 111*a* is not stiffened, and that splitting corresponds to complete splitting in the buried weak plane 12, when the front side 111*a* is stiffened.

As was recalled in the introduction, the kinetics of blistering and splitting have been widely studied, in many single-crystal semiconductors, and under various ion-implantation conditions. It will therefore be within the ability of those skilled in the art to find or determine information on blistering thermal budget and splitting thermal budget for one particular type of single-crystal semiconductor and particular ion-implantation conditions.

Figure 2C:
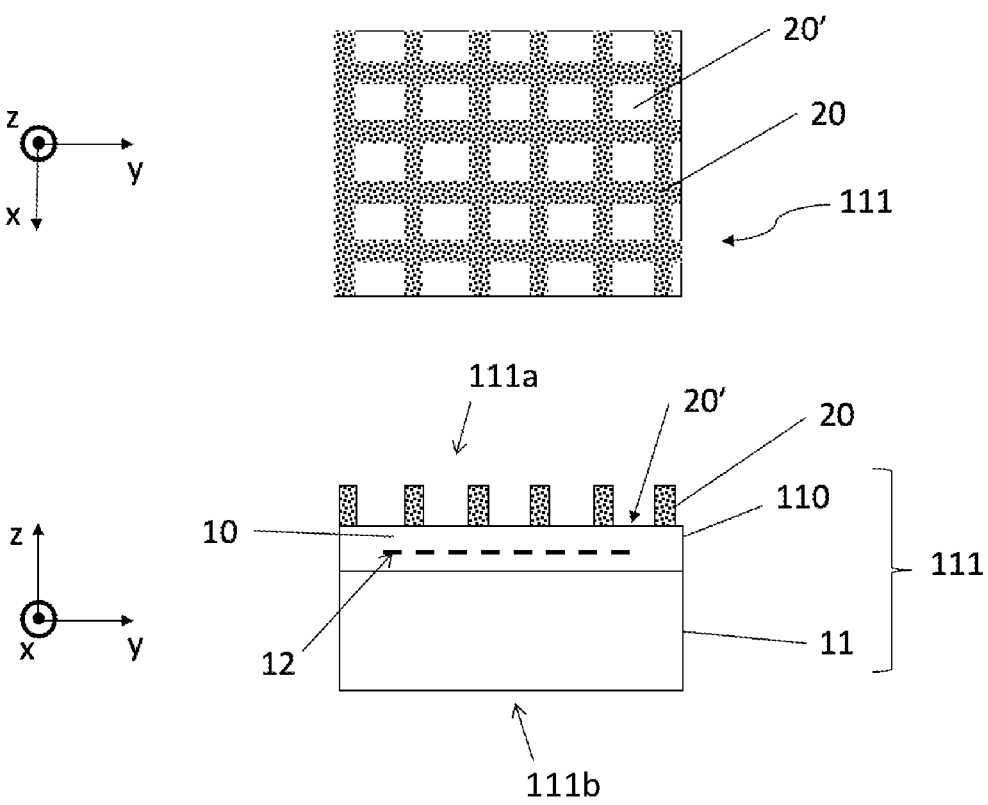

The fabricating method then comprises a step c) of forming a stiffening film 20 on the front side 111*a* of the donor substrate 111 (FIG. 2C). This step is carried out with application of a thermal budget lower than the first thermal budget: the objective here is to remain below the thermal budget liable to generate deformation of the thin layer 10 by blistering or its partial delamination, as a result of growth of the microcracks in the buried weak plane 12.

In addition, the stiffening film 20 is apertured, and takes the form of a grid in the plane of the front side 111*a*, with a degree of coverage lower than or equal to 30%, and preferably between 5% and 30%. Because of its grid form, the apertured stiffening film 20 defines a plurality of bare regions of the front side 111*a* (apertured regions of the stiffening film 20) that form features 20' the lateral dimensions of which are smaller than or equal to 50 microns. The lateral dimensions are the dimensions of the features in the (x,y)-plane of the front side 111*a* of the donor substrate 111. At least one dimension of the features 20' may be smaller than or equal to 20 microns, than 10 microns, or even than 5 microns, or even than 2 microns. The features 20' may have a square shape, a rectangular shape, a triangular shape, a circular shape or another polygonal shape. The width of the grid lines, in the (x,y)-plane, i.e., the width of the lines separating the features 20' defined by the stiffening film 20, may be between 5 microns and 50 microns.

The stiffening film 20 furthermore has a thickness larger than or equal to 0.5 microns, typically between 0.5 microns and 50 microns, and preferably between 0.5 microns and 5 microns.

The role of the apertured stiffening film 20 is to maintain the mechanical integrity of the thin layer 10 in the following step d) of depositing the carrier substrate 200, which requires a thermal budget higher than the blistering first thermal budget, or even higher than or equal to the splitting second thermal budget.

Another advantage of the apertured stiffening film 20 is that it allows direct contact to be made between the thin layer 10 and the carrier substrate 200 over an area larger than 70% of the area of the thin layer 10. This is particularly advantageous with respect to vertical electrical conduction in the future composite structure 1 because deposition of the carrier substrate 200 at high temperatures is very favorable to the obtainment of a good quality interface with the thin layer 10. The apertured stiffening film 20, for its part, does not need to ensure electrical conduction between the thin layer 10 and the carrier substrate 200. It may therefore comprise a wide variety of materials, in particular, chosen from tungsten, silicon carbide, silicon, silicon nitride, boron nitride, silicon oxide, aluminum oxide, aluminum nitride, etc. The crystal quality of the apertured stiffening film 20, and the quality of its interface with the thin working layer 10 are not critical, this permitting the stiffening film 20 to be formed with a low thermal budget. Care will nevertheless be taken to choose, for the stiffening film 20, a material that is compatible with the temperatures applied in the following steps of the method (in particular, in following step d)), and typically a material the melting point of which is higher than the temperatures involved in the steps will be chosen.

To form the stiffening film 20, step c) comprises one or more sequences of depositing, bonding, photolithography, nanoimprinting, etching and/or thinning, or any other technique allowing an apertured film taking the form of a grid to be produced. For example, the apertured stiffening film 20 may be produced by depositing a continuous film, then carrying out lithography to define the grid, and lastly etching the features 20' to create the bare regions on the front side 111*a* of the donor substrate 111.

Figure 3:
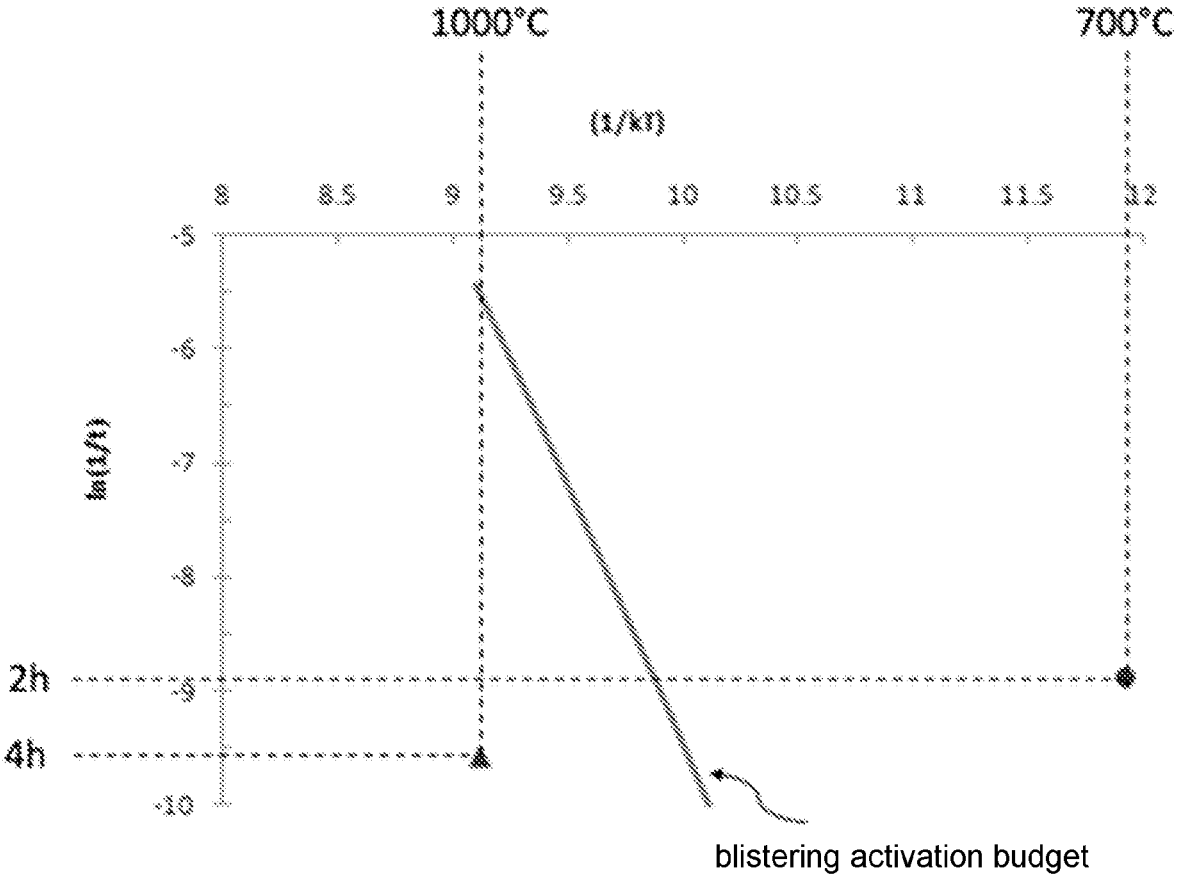
FIG. 3 shows an Arrhenius plot of blistering time versus temperature in the case of a donor substrate made of SiC implanted with a dose of $6\times10^{16}$ H/cm$^2$ and an energy of 150 keV, which substrate is used by way of example in the description below.

By way of example, in the case of a donor substrate 111 made of c-SiC (and of a donor layer 110 made of c-SiC, if one is present) implanted with hydrogen ions with an energy of 150 keV and with a dose of $6\times10^{16}$ H+/cm$^2$, the buried weak plane 12 being located at about 800 nm depth except in an annular peripheral region 12*b* of 5 mm width, the temperature of step c) is chosen to be lower than 800° C., or even lower than or equal to 500° C. In this temperature range, blistering takes a long time to occur (see FIG. 3), and permits a stiffening film 20 made of polycrystalline silicon carbide of 2 μm thickness to be formed by thermal CVD, for example, at about 700° C. in a time of about 2 h. The black circle in FIG. 3 represents this thermal budget, which as may be seen is far lower than the blistering thermal budget.

A conventional step of photolithography and etching then allows the apertured stiffening film 20 made of polycrystalline SiC, which defines square features 20' of 25 microns side length and a grid the lines of which are 4 microns in width, to be finalized. The degree of coverage of the grid is of the order of 25%.

Figure 2D:
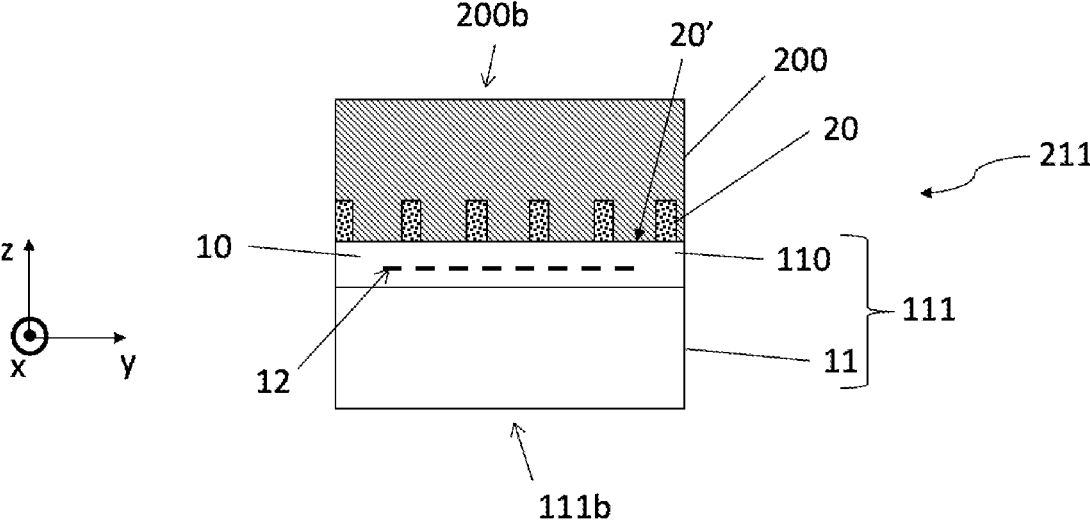

The fabricating method according to the present disclosure then comprises the step d) of depositing the carrier substrate 200 on the front side 111*a* of the donor substrate 111, which side is equipped with the apertured stiffening film 20 (FIG. 2D). The deposition of step d) is carried out with application of a thermal budget higher than the first thermal budget (namely, the blistering thermal budget) or even higher than or equal to the (splitting) second thermal budget.

The high temperatures preferred in step d) promote the structural quality of the carrier substrate 200 and the quality of its interface with the thin layer 10. The deposition may be carried out using any known technique, and, in particular, thermal chemical vapor deposition (TCVD), plasma-enhanced chemical vapor deposition (PECVD) or physical vapor deposition (PVD).

At the end of the deposition of step d), the stack 211 will have been formed and the carrier substrate 200 will have a thickness larger than or equal to 50 microns, or even larger than or equal to 200 microns or even than 300 microns.

As mentioned above, the high thermal budget applied in step d) does not irremediably damage the thin layer 10 because the apertured stiffening film 20 mechanically braces the thin layer 10, thereby limiting blistering and preventing any local exfoliation of the thin layer 10.

Depending on the targeted composite structure 1, the carrier substrate 200 may have a single-crystal or polycrystalline structure and comprise at least one material chosen from silicon carbide, silicon, diamond, III-V or III-N compounds such as gallium nitride, gallium oxide, etc.

As the deposition of step d) involves a thermal budget higher than the blistering first thermal budget, or even higher than or equal to the splitting second thermal budget, and as the stiffening film 20 limits expansion of the microcracks to form blisters and prevents the appearance of local exfoliation of the thin layer 10, the microcracks will merge together and propagate through the buried weak plane 12, in step d).

The fact that the buried weak plane 12 does not extend to the edges of the donor substrate 111, because of the exclusion of an annular peripheral region 12*b*, prevents the splitting, which propagates through the buried weak plane 12, from causing premature cleaving between the composite structure 1 (thin layer 10, stiffening film 20 and carrier substrate 200) and the remainder 111' of the donor substrate. Specifically, if the thickness of the carrier substrate 200 is too small, the composite structure 1 will tend to fragment and break because it will be on the whole too thin to be self-supporting. Since splitting along the buried weak plane 12 occurs rapidly with high thermal budgets, the annular peripheral region 12*b* allows the stack 211 to be kept attached, until the thickness desired for the carrier substrate 200, which is typically larger than or equal to 50 microns, has been obtained.

Returning to the aforementioned example of a donor substrate 111 made of c-SiC and of a stiffening film 20 made of p-SiC, a carrier substrate 200 made of p-SiC may be formed on the front side 111*a* of the donor substrate 111, which side is provided with the apertured stiffening film 20. To do this, p-SiC is deposited by thermal CVD at a temperature between 900° C. and 1500° C., and, for example, at 1000° C., for 4 h, to achieve a thickness of 400 microns; the black triangle in FIG. 3 represents this thermal budget, which as may be seen is much higher than the first thermal budget (blistering activation budget).

Splitting along the buried weak plane 12 occurs less than one hour after the start of deposition: the thermal budget of the deposition of step d) is here also higher than the splitting thermal budget. The stack 211 is nevertheless kept whole because of the presence of the annular peripheral region 12*b* devoid of buried weak plane 12.

Lastly, the fabricating method according to the present disclosure comprises a step e) of cleaving the stack 211, to form, on the one hand, the composite structure 1 and, on the other hand, the remainder 111' of the donor substrate (FIG. 2E), which includes a portion 110' of the donor layer 110.

This cleaving may be achieved mechanically or chemically. Application of a mechanical stress to the edges of the stack 211, for example, via insertion of a tool (for example, a blade or a bevel) may cause the annular peripheral region 12*b* to crack and the stack 211 to cleave. Alternatively, chemical etching of the edges of the donor substrate 111 (in the annular peripheral region 12*b*), applied alone or conjointly with a mechanical stress, also allows the cleave of step e) to be obtained.

Figure 2E:
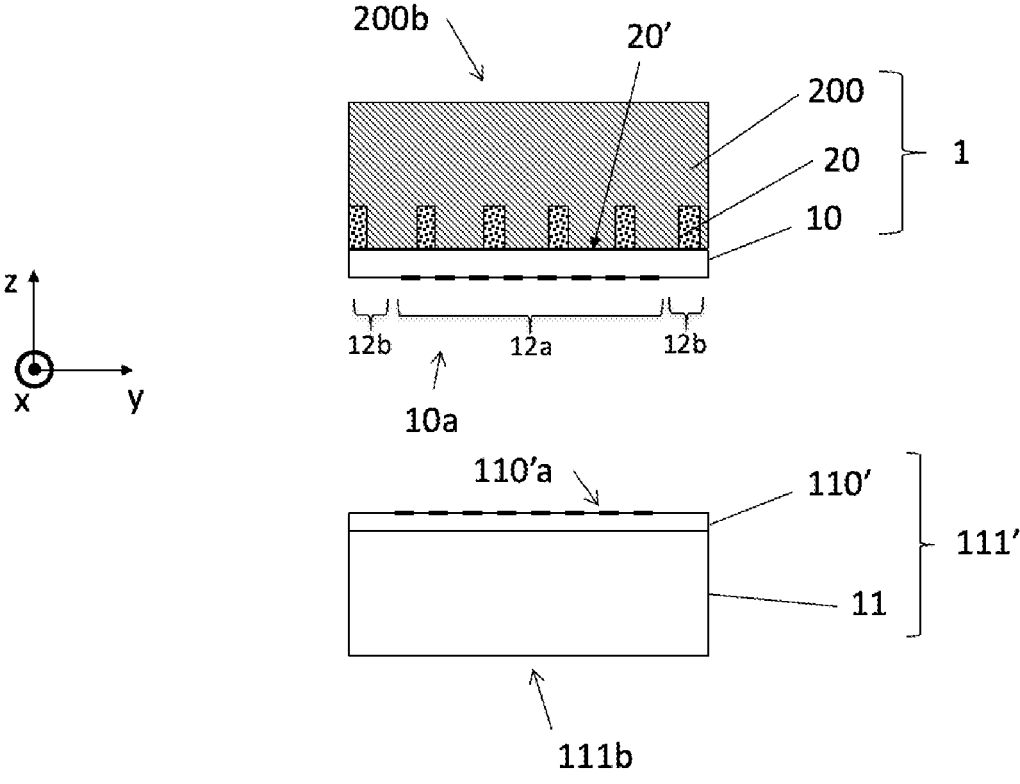
Figure 2F:
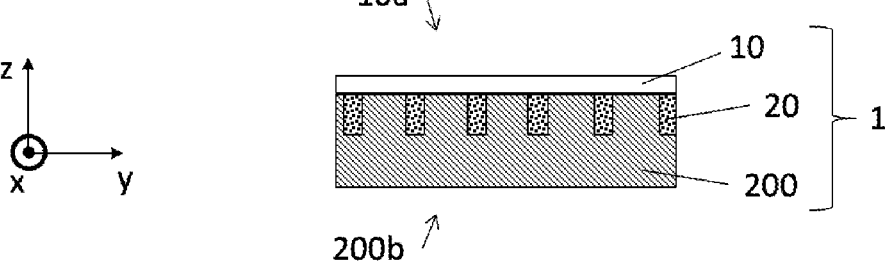

Even though this is not illustrated in FIG. 2E, the cleaving step may generate non-uniformities in the thickness and substantially increase the roughness of the thin layer 10, in the annular peripheral region 12*b*, because the thin layer 10 will not necessarily be integrally transferred in the annular peripheral region 12*b*. These defects will possibly be treated in a subsequent step f) of the method.

The fabricating method according to the present disclosure may comprise a step f) of carrying out one or more mechanical and/or chemical and/or heat treatments on the composite structure 1, in order to smooth the free surface of the thin layer 10 and/or to improve the quality of the edges of the composite structure 1 (edges of the thin layer 10 or edges of the carrier substrate 200) and/or to correct the thickness uniformity of the composite structure 1.

As is known per se, at the end of cleaving step e), the free side 10*a* of the thin layer 10 of the composite structure 1 has a surface roughness between 5 and 100 nm RMS (measured with an atomic force microscope (AFM), with scans of 20 microns×20 microns), at least in its central region 12*a*.

Step f) may then comprise chemical-mechanical polishing (CMP) of the free side 10*a* of the thin layer 10, typically with removal of the order of 50 nm to 1000 nm of material, so as to obtain a final roughness lower than 0.5 nm RMS (in an AFM field of 20×20 μm), or even lower than 0.3 nm. Step f) may also comprise a chemical or plasma treatment (cleaning or etching), for example, an SC1/SC2 clean (SC1 being the acronym of Standard Clean 1, and SC2 being the acronym of Standard Clean 2) and/or an HF clean (HF being the acronym of hydrofluoric acid), or a treatment in an N2, Ar, CF4 plasma, etc., to further improve the quality of the free side 10*a* of the thin layer 10.

Furthermore, chemical-mechanical polishing (CMP) and/or a chemical treatment (etching or cleaning) and/or a mechanical treatment (grinding) of the back side 200*b* of the carrier substrate 200 may be applied. Such a treatment allows the thickness uniformity of the carrier substrate 200 and the roughness of its back side 200*b* to be improved. A roughness lower than 0.5 nm RMS (measured with an atomic force microscope (AFM) in fields of 20 microns×20 microns) is desirable for production of vertical components, in which at least one metal electrode will be present on the back side 200*b* of the composite structure 1.

It will be noted that these treatments applied to the back side 200*b* of the carrier substrate 200 could optionally be applied just before the cleaving step, step e), i.e., before the free side 10*a* of the composite structure 1 is exposed, so as to limit the contamination thereof especially during contamination- or stress-inducing treatments such as chemical etching or mechanical lapping (or mechanical grinding).

Polishing or grinding of the edges of the composite structure 1 will possibly also be performed in this step f) with a view to making the shape of its circular outline and of its bevel compatible with the requirements of microelectronic fabricating methods.

Again, according to one advantageous embodiment, step f) may comprise a high-temperature heat treatment (for example, at a temperature between 1000° C. and 1900° C., depending on the nature of the materials of the composite structure 1) for about one hour and up to a few hours. The objective of this step is to stabilize the composite structure 1, by healing structural or surface defects still present in and/or on the thin layer 10, and, where appropriate, by making the crystalline configuration of the carrier substrate 200 change, so as to make the composite structure 1 compatible with the subsequent high-temperature heat treatments required to fabricate components on the thin layer 10, i.e., treatments such as epitaxial growth, anneals for activating dopants, depositions, etc.

The method according to the present disclosure may comprise an additional step of epitaxial growth of an additional layer on the thin layer 10 of the composite structure 1. Such a step is applied when a relatively large working-layer thickness is required for the fabrication of components, i.e., a thickness typically of the order of 5 to 50 microns. The conditions of this epitaxial growth may optionally be chosen to be similar to those of step a), though preferably temperature will be kept lower so as to limit the stresses induced in the working layer (which corresponds to the assembly consisting of the thin layer 10 and the additional layer) as a result of the potentially heterogeneous materials of the composite structure 1.

Lastly, the fabricating method may comprise a step of reconditioning the remainder 111' of the donor substrate with a view to reusing it as initial substrate 11 or as donor substrate 111. Such a reconditioning step is based on treating the side 110'*a* (FIG. 2E) one or more times, by chemical-mechanical polishing the surface or edges thereof, and/or by mechanical grinding thereof, and/or by dry or wet chemical etching thereof. Preferably, the thickness of the donor layer 110, when it is formed in step a), is defined so that the remainder 111' of the donor substrate 111 may be reused at least twice as donor substrate 111.

The present disclosure also relates to a composite structure 1 resulting from the fabricating method such as described above. The composite structure 1 is particularly suitable for power applications: a composite structure comprising a thin layer 10 made of c-SiC of high crystal quality, a stiffening film 20 made of p-SiC and a carrier substrate made of p-SiC, i.e., a structure such as described above by way of example, is very favorable to the production of vertical power components.

The composite structure 1 may thus comprise a (or more than one) vertical power component(s), such as, for example, a transistor, a diode or any high-voltage and/or high-frequency component produced using one of the many manufacturing techniques known in the art. The composite structure 1 according to the present disclosure is entirely compatible with the techniques.

In the case of a vertical power component, all or some of the component is formed on and/or in the thin layer 10, and a metal electrode is produced on the back side 200b of the carrier substrate 200. The direct contact between the thin layer 10 and the carrier substrate 200, which exists in the apertured features 20' of the stiffening film 20, ensures a good vertical electrical conduction, and effective conduction of heat. Electrical conduction is guaranteed whatever the material of the stiffening film 20, this increasing the options as regards selection of the material, only mechanical stiffness being essential.

It will also be recalled that the lateral dimensions of the targeted power components are of the order of one square millimeter, this being significantly larger than the size of the features 20' and the grid lines defined by the apertured stiffening film 20: a vertical electrical contact will therefore always exist between the thin layer 10 and the carrier substrate 200 plumb with each manufactured component. The shape and dimensions of the grid will possibly be tailored to the design and distribution of the components intended to be manufactured on the composite structure 1.

Types of composite structures 1 other than the SiC-based structure given by way of example may of course be manufactured with the fabricating method according to the present disclosure, using other combinations of materials. By way of nonlimiting example, mention may be made of the following thin single-crystal layer (10)/apertured stiffening film (20)/carrier substrate (200) stacks:

GaN/Si/Diamond
GaN/W/SiC
SiC/SiO2/Diamond
Si/SiO2/Diamond
Si/SiO2/SiC
Diamond/Si/Diamond.

Of course, the present disclosure is not limited to the embodiments and examples that have been described, and variant embodiments may be implemented without departing from the scope of the invention such as defined by the claims.

The invention claimed is:

1. A method of fabricating a composite structure comprising a thin layer of a single-crystal semiconductor, the thin layer being disposed on a carrier substrate, the method comprising:
    a) providing a donor substrate composed of the single-crystal semiconductor;
    b) implanting ions of a light species into the donor substrate, with the exception of an annular peripheral region of the donor substrate, under implantation conditions, to form a buried weak plane delimiting the thin layer between the buried weak plane and a front side of the donor substrate;
        the buried weak plane comprising lenticular microcavities apt to develop, when activated thermally, into microcracks;
        the implantation conditions defining a first thermal budget for obtaining blistering on the front side of the donor substrate, and a second thermal budget for obtaining splitting in the buried weak plane; and
        the blistering corresponding to deformation of the thin layer plumb with the microcracks, and the splitting corresponding to complete splitting in the buried weak plane;

c) forming a stiffening film on the donor substrate, carried out with application of a thermal budget lower than the first thermal budget, the stiffening film:
        being apertured and taking, in the plane of the front side, the form of a grid with a degree of coverage between 5% and 30%, and leaving a plurality of regions of the front side bare, these regions taking the form of features the lateral dimensions of which are smaller than or equal to 50 microns; and
        having a thickness larger than or equal to 0.5 microns;
    d) depositing a carrier substrate on the front side of the donor substrate, the front side having the stiffening film thereon, the depositing of the carrier substrate being carried out with application of a thermal budget higher than the first thermal budget; and
    e) cleaving to form the composite structure and a remainder of the donor substrate.

2. The method of claim 1, wherein the annular peripheral region of the donor substrate in which ions are not implanted has a width between 1 mm and 2 cm.

3. The method of claim 2, wherein the depositing of the carrier substrate is carried out with application of a thermal budget higher than or equal to the second thermal budget.

4. The method of claim 3, wherein the single-crystal semiconductor of the donor substrate comprises a material selected from among the group consisting of: silicon carbide, silicon, germanium, a III-V or III-N compound, diamond, and gallium oxide.

5. The method of claim 4, wherein the stiffening film comprises a material selected from among the group consisting of: tungsten, silicon carbide, silicon, silicon nitride, boron nitride, silicon oxide, aluminum oxide, and aluminum nitride.

6. The method of claim 5, wherein the forming of the stiffening film comprises one or more sequences of depositing, bonding, photolithography, nanoimprinting, etching and/or thinning.

7. The method of claim 6, wherein the thickness of the apertured stiffening film is between 0.5 microns and 5 microns.

8. The method of claim 7, wherein the carrier substrate has a single-crystal or polycrystalline structure and comprises at least one material selected from among the group consisting of: silicon carbide, silicon, diamond, a III-V compound, and gallium oxide.

9. The method of claim 8, wherein, after the depositing of the carrier substrate, the carrier substrate has a thickness larger than or equal to 50 microns.

10. The method of claim 9, further comprising, after the cleaving, carrying out one or more mechanical and/or chemical and/or heat treatments on the composite structure to smooth the free surface of the thin layer and/or to improve the quality of the edges of the composite structure and/or to correct the thickness uniformity of the composite structure.

11. The method of claim 10, further comprising reconditioning the remainder of the donor substrate to form a new donor substrate.

12. The method of claim 1, wherein the depositing of the carrier substrate is carried out with application of a thermal budget higher than or equal to the second thermal budget.

13. The method of claim 1, wherein the single-crystal semiconductor of the donor substrate comprises a material selected from among the group consisting of: silicon carbide, silicon, germanium, a III-V or III-N compound, diamond, and gallium oxide.

14. The method of claim 1, wherein the stiffening film comprises a material selected from among the group consisting of: tungsten, silicon carbide, silicon, silicon nitride, boron nitride, silicon oxide, aluminum oxide, and aluminum nitride.

15. The method of claim 1, wherein the forming of the stiffening film comprises one or more sequences of depositing, bonding, photolithography, nanoimprinting, etching and/or thinning.

16. The method of claim 1, wherein the thickness of the apertured stiffening film is between 0.5 microns and 5 microns.

17. The method of claim 1, wherein the carrier substrate has a single-crystal or polycrystalline structure and comprises at least one material selected from among the group consisting of: silicon carbide, silicon, diamond, a III-V compound, and gallium oxide.

18. The method of claim 1, wherein, after the depositing of the carrier substrate, the carrier substrate has a thickness larger than or equal to 50 microns.

19. The method of claim 1, further comprising, after the cleaving, carrying out one or more mechanical and/or chemical and/or heat treatments on the composite structure to smooth the free surface of the thin layer and/or to improve the quality of the edges of the composite structure and/or to correct the thickness uniformity of the composite structure.

\* \* \* \* \*